United States Patent [19]

Nakazaki et al.

[11] Patent Number: 5,210,598

[45] Date of Patent: May 11, 1993

[54] SEMICONDUCTOR ELEMENT HAVING A RESISTANCE STATE TRANSITION REGION OF TWO-LAYER STRUCTURE

[75] Inventors: Yasunori Nakazaki; Kazuki Hirakawa, both of Suwa, Japan

[73] Assignee: Seiko Epson Corporation, Tokyo, Japan

[21] Appl. No.: 609,109

[22] Filed: Oct. 31, 1990

Related U.S. Application Data

[63] Continuation of Ser. No. 397,523, Aug. 23, 1989, abandoned.

[30] Foreign Application Priority Data

| Aug. 23, 1988 | [JP] | Japan | 63-209034 |
| May 19, 1989 | [JP] | Japan | 1-124486 |
| Jul. 18, 1989 | [JP] | Japan | 1-185387 |

[51] Int. Cl.$^5$ .................... H01L 45/00; H01L 27/02; H01L 29/04

[52] U.S. Cl. .................................................. 257/530

[58] Field of Search ............... 357/51, 2, 51, 91, 59

[56] References Cited

U.S. PATENT DOCUMENTS

| 4,317,686 | 3/1982 | Anand et al. | 357/91 |
| 4,424,578 | 1/1984 | Miyamoto | 357/51 |
| 4,424,579 | 1/1984 | Roesner | 365/105 |
| 4,442,507 | 4/1984 | Roesner | 365/100 |
| 4,458,297 | 7/1984 | Stopper et al. | 357/2 |
| 4,495,010 | 1/1985 | Kranzer | 357/49 |
| 4,543,594 | 9/1985 | Mohsen et al. | 357/51 |
| 4,590,589 | 5/1986 | Gerzberg | 357/51 |
| 4,598,386 | 7/1986 | Roesner et al. | 365/105 |
| 4,627,723 | 10/1986 | Sukai | 148/1.5 |
| 4,847,732 | 9/1989 | Stopper et al. | 357/2 |
| 4,862,243 | 8/1989 | Welch et al. | 357/51 |
| 4,882,611 | 11/1989 | Blech et al. | 357/2 |
| 4,922,319 | 5/1990 | Fukashima | 357/51 |

OTHER PUBLICATIONS

S. M. Sze, *Semiconductor Devices, Physics and Technology*, John Wiley & Sons (New York) 1985 pp. 38, 66.

*Primary Examiner*—J. Carroll
*Attorney, Agent, or Firm*—Spensley Horn Jubas & Lubitz

[57] ABSTRACT

A semiconductor element chiefly serving as an anti fuse and a manufacturing method thereof, the anti fuse storing data by causing a transition from a high resistance state to a low resistance state by a current supplied when a voltage is imposed. The element has a three-layer electrode structure composed of an upper electrode, amorphous silicon and a silicon insulation film thereby to improve the stability and reproducibility of the programming voltage and current.

8 Claims, 2 Drawing Sheets

SEMICONDUCTOR ELEMENT HAVING A RESISTANCE STATE TRANSITION REGION OF TWO-LAYER STRUCTURE

This is a continuation of application Ser. No. 07/397,523, filed on Aug. 23, 1989, now abandoned.

BACKGROUND OF THE INVENTION:

1. Field of the Invention

The present invention relates to a semiconductor element and a manufacturing method thereof, and more specifically, to a semiconductor element which chiefly serving as an "anti fuse" and a manufacturing method thereof, the anti fuse storing data by causing a transition from a high resistance state to a low resistance state by a current supplied when a voltage is imposed.

2. Description of the Related Arts

An anti fuse operates such that when a voltage is imposed to an electrode of a semiconductor element and a current is supplied thereto, the current causes the electrode to change from a nonconductive state to a conductive state. More specifically, the anti fuse forms a semiconductor element which has a characteristic and function opposite to those of a "fuse", wherein, for example, a conductive state is conventionally changed to a nonconductive, state by breaking a wiring of polysilicon.

Conventionally, chalcogenide and amorphous silicon are known as materials used for the anti fuse, and examples of their practical applications are shown in the following documents. The feature of the anti fuse shown in these documents will be described below.

Document 1: Japanese Examined Patent Publication No 47-32944/72

The energy applied to a high resistance semiconductor material composed of amorphous silicon by irradiating an electron beam, a laser beam and the like cases a stable high resistance state of the semiconductor to change to a stable low resistance state.

Document 2: Japanese Examined Patent Publication No. 57-4038/82

A PROM device composed of high resistance polysilicon of which the resistance value is unreversibly changed by an imposed electric field.

Document 3: Japanese Laid Open Application No. 54-88739/79

An EEPROM device composed of tellurium-based chalcogenide having a high electric resistance in an amorphous state and a low electric resistance in a crystallized state.

This anti fuse is applied to a simple wiring connection switch in an IC, a PLA (programmable logic array) and a redundant circuit of a memory, and further to a PROM, and its application to these devices is under consideration.

FIG. 2 is a schematic partly cross-sectional view of a conventional semiconductor element used as the above anti fuse and of a type most closely related to the semiconductor element of the present invention.

In FIG. 2, 201 designates a semiconductor substrate, 202 designates an impurity diffusion layer formed on the surface the semiconductor substrate 201, 203 and 203a designated an inter-layer insulation film, 204 designates a wiring electrode, 205 designates an amorphous silicon region, and 206 designates an upper electrode formed on the amorphous silicon 205. Note, the amorphous silicon 205 is a high resistance member.

The upper electrode 206 is composed of a conductive material and is formed simultaneously when the wiring electrode 204 is formed.

In this arrangement, the wiring electrode 204 and the amorphous silicon 205 are formed substantially in contact with the opposite ends of the impurity diffusion layer 202 and the amorphous silicon 205 is inserted between the upper electrode 206 and a lower electrode composed of the impurity diffusion layer 202, wherein the amorphous silicon of high resistance serves as a chief constitutional portion of the above anti fuse. More specifically, when a voltage is imposed between the upper electrode 206 and the wiring electrode 204 coupled with the lower electrode 202 to supply a current, an unreversible transition from a high resistance state to a lower resistance state is caused in the amorphous silicon 205 between both the electrodes. That is, a memory element can be composed by making use of the fact that a portion of the amorphous silicon 205 is changed from a nonconductive state to a conductive state.

The conventional semiconductor element arranged as described above is preferably provided with a higher resistance value before transition, $R_{off}$, and a lower resistance value, $R_{on}$, after transition from the view point of the performance of the element. While the amorphous silicon is not preferable because the resistance value before transition, $R_{off}$, thereof is a little lower than that of an insulation film composed of an oxide film, it is more reliable than an element using a breakage in an insulation film, and thus it has both advantages and disadvantages. Further, the conventional element is not preferably arranged, because the $R_{off}$ is considerably lowered in the state before transition although it is effective that acceptor ions, donor ions or the like are added to the amorphous silicon to lower the resistance value after transition, $R_{on}$.

SUMMARY OF THE INVENTION

An object of the present invention to overcome the above drawbacks and to provide a semiconductor element having amorphous silicon with $R_{off}$ as high as that of an insulation material, having an effect of lowering $R_{on}$ achieved by the addition of impurity ions and a method of manufacturing this semiconductor, and also never affecting the other semiconductor element on the same substrate.

The semiconductor element according to the present invention is characterized in that the semiconductor element forming the anti fuse which changes from a high resistance state to a low resistance state is composed of a four-layer structure of; a lower electrode; a silicon insulation film; amorphous silicon; and an upper electrode. This four-layer structure includes two cases; a case wherein the silicon insulation film, the amorphous silicon and the upper electrode are sequentially formed from this side of an impurity diffusion layer or polycrystalline silicon of a lower electrode; and a case wherein the amorphous silicon, the silicon insulation film and the upper electrode are sequentially formed from this side. The amorphous silicon used for the above two cases may contain an impurity element of Group III, such as B, Al, Ga or Group V, such as P, As, Sb.

Further, a method of manufacturing the semiconductor element according to the present invention comprises the steps of forming an inter-layer insulation film on a semiconductor substrate on which a lower electrode is formed, providing a contact hole for one of the electrodes thereon, forming a silicon oxidation film and amorphous silicon in this order in the contact hole by a CVD method, a thermal oxidation method or an $H_2SO_4 = H_2O_2$ treatment, forming an upper electrode on the patterned amorphous silicon for forming an electrode of a four-layer structure of a lower electrode, a silicon insulation film, amorphous silicon and the upper electrode on the amorphous silicon, and forming the wiring electrode in a contact hole for a wiring electrode formed in a second patterning.

In addition, another method of manufacturing the semiconductor element according to the present invention comprises the steps of first depositing amorphous silicon to the above first contact hole, forming a silicon insulation film and then forming the semiconductor element having an electrode of a four-layer structure of a lower electrode, amorphous silicon, a silicon insulation film and an upper electrode.

According to the present invention, since the element serving as the anti fuse in the semiconductor element is formed as the four-layer structure composed of the upper electrode, the amorphous silicon, the silicon insulation film and a lower electrode in the semiconductor element, the $R_{off}$ is made higher by the silicon insulation film having a higher specific resistance and the reliability of the anti fuse is secured by the characteristic of the amorphous silicon. The silicon insulation film is to be very thin to achieve the higher $R_{off}$, and since the film made very thin can be easily broken by imposing a program voltage, the $R_{on}$ is almost not affected and its resistance can be easily lowered.

Further, in a case wherein the impurity of Group III such as B, Al, Ga or Group V such as P, As, S is doped to the amorphous silicon region of the four-layer structure, when an ion implantation is carried out at $10^{15} cm^{-3}$, a portion of the amorphous silicon is melted by joule heat produced by a current supplied by a programming (writing) voltage imposed and when the portion is cooled, it perhaps changes to something like a polycrystalline material. At the time, the impurity element dopant is taken into something like this poly crystal material (which is referred to as a filament in the academic and patent fields) and activated thereby to lower the $R_{on}$.

DESCRIPTION OF THE PREFERRED EMBODIMENTS

Embodiment 1

Figure 1:
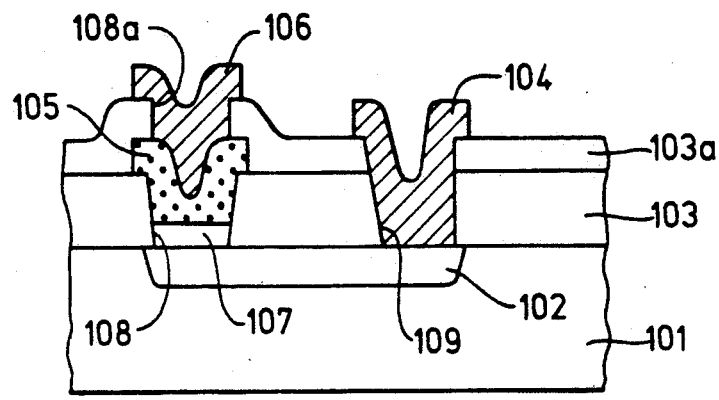
FIG. 1 is a partial cross-sectional view of an embodiment of a semiconductor element according to the present invention.

FIG. 1 is a cross-sectional view of an embodiment of a semiconductor element according to the present invention, where 101 designates a semiconductor substrate, for example, of monocrystalline silicon, 102 designates an n+ type or p+ type impurity diffusion layer (lower electrode), 103 and 103a designate interlayer insulation films, 104 designates a wiring electrode such as of aluminum, 105 designates an amorphous silicon film or body, 106 designates an upper electrode such as of aluminum, 107 designates a silicon insulation film composed of $SiO_2$ or $Si_3N_4$; 108 designates a contact hole in film 103 and 108a designates a contact hole in film 103a. An electrode having a four-layer structure serving as a chief constitutional portion of an anti fuse is composed of the upper electrode 106, the amorphous silicon body 105, the silicon insulation film 107 and the lower electrode 102. This arrangement is characterized in that the silicon insulation film 107 is interposed between lower electrode 102 comprising the impurity diffusion layer and the amorphous silicon 105 as compared with the prior art shown in FIG. 2.

Figure 2:
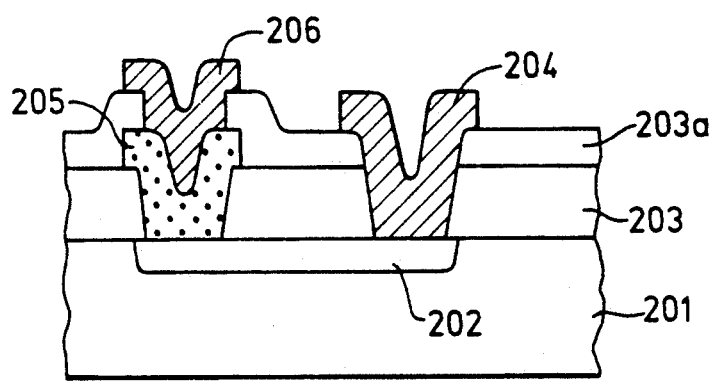
FIG. 2 is a partial cross-sectional view explanatory of the structure of a conventional semiconductor element.

In the case wherein the silicon insulation film 107 is interposed between the amorphous silicon 105 and the lower electrode (impurity diffusion layer) 102, as shown in FIG. 1, when the amorphous silicon is deposited, the silicon insulation film is formed at the surface of the silicon substrate where the amorphous silicon is brought into contact with the insulation film and thus the amorphous silicon can be uniformly formed because the crystal state of this insulation film is amorphous state with the result of improved stability and reproducibility for a given programming voltage and current. This is a great improvement as compared with a case wherein, when the amorphous silicon is deposited on the substrate as shown in FIG. 2, an abnormal deposition is susceptible to be formed based on a silicon crystal, and thus the amorphous silicon cannot be uniformly formed.

Note that the amorphous silicon 105 may be doped with an impurity element of Group III such as B, Al, Ga or Group V such as P, As, S having the same conductivity type as the impurity diffusion layer of the lower electrode 102, wherein, as described above, $R_{on}$ can be lowered as compared with a case wherein doping is not effected.

Embodiment 2

Figure 3:
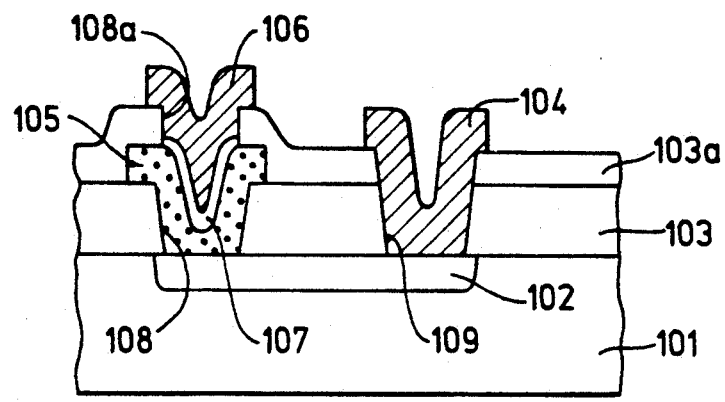
FIG. 3 is a partial cross-sectional view of another embodiment of a semiconductor element according to the present invention.

FIG. 3 is a partial cross-sectional view another embodiment of a semiconductor element according to the present invention. The same numerals as used in the embodiment showing in FIG. 1 are used to denote the same or corresponding parts in FIG. 3 and the description thereof is omitted.

The embodiment showing in FIG. 3 has a silicon insulation film 107 interposed between amorphous silicon body 105 and upper electrode 106. The amorphous body 105 may also be doped with an impurity element of Group III such as B, Al, Ga or Group V such as P, As, S to lower $R_{on}$ as in the embodiment 1.

In the case wherein the silicon insulation film 107 is interposed between the amorphous silicon body 105 and the upper electrode 106 as in the embodiment in FIG. 3, even if a pin hole develops in a barrier metal such as TiN or the like used under the upper electrode 106 and aluminum enters, for example, less of a reaction is caused between the aluminum and the silicon insulation film 107 and thus problems such as reduced product yield are prevented. Since amorphous silicon remarkably reacts with aluminum, such a reaction is promoted even at 300° C. without the above barrier metal. Therefore, the present invention overcomes a problem of the prior art, that is, short circuit occurs during manufacture of a semiconductor element. If a barrier metal is used, and a pin hole or the like occurs, the yield will decrease.

Embodiment 3

Figure 4:
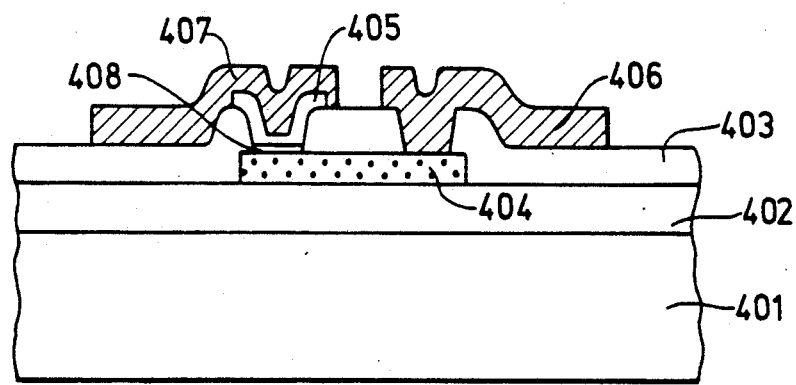
FIG. 4 is a partial cross-sectional view of another embodiment of a semiconductor element according to the present invention.

FIG. 4 is a partial cross-sectional view of another embodiment of a semiconductor element according to the present invention. This includes a silicon substrate 401 and silicon oxide films 402 and 403. This embodiment uses a polycrystalline silicon region 404 as a lower electrode. A silicon oxide layer 408 is provided thereon. An amorphous silicon body 405 is provided thereon. The upper electrode 407 is provided thereon. Thus this embodiment has a four-layer structure. A program is made by Joule heat generated when a constant voltage is applied between the electrodes. In this embodiment, polycrystalline silicon is used as the lower electrode 404 and it is surrounded by silicon oxide, thereby reducing the conduction of heat and accelerating the increase of temperature due to Joule heat. Therefore, a highly effective program can be performed. Lower electrode 404 is connected to a wiring electrode 406.

Further, silicon oxide film 408 can be provided around polycrystalline silicon region 404, that is, polycrystalline silicon 404 and amorphous silicon 405; between amorphous silicon body 405 and upper electrode 407; and on both sides of amorphous silicon 405.

Embodiment 4

An embodiment of a method of manufacturing the semiconductor element according to the present invention will be described with reference to the semiconductor element shown in FIG. 1. This embodiment will be described in the sequence of process steps (a) to (f). Note that a process step (c2) is an additional process step for doping an impurity element to amorphous silicon. This process step, however, is omitted when the doping is not necessary.

Process step (a): the impurity diffusion layer 102 is formed on the silicon (Si) semiconductor substrate 101, the interlayer film 103 composed of $SiO_2$ or $Si_3N_4$ is formed on the overall surface thereof, and then a contact hole 108 is formed, by lithography at a prescribed location on the impurity diffusion layer 102 where the amorphous silicon is to be deposited.

Process step (b): $SiO_2$ is deposited to a thickness of 100°Å or less; e.g., 50°Å by a CVD method to form the silicon insulation film 107 at the bottom of the contact hole 108.

Process step (c): the amorphous silicon body 105 is deposited to a thickness of about 1500°Å by a CVD method nearly at 560° C. and embedded in the contact hole 108.

Process step (c2): an impurity element is doped to the amorphous silicon in this process step; for example, when P (element of Group V) is used as n type impurity, p+ is ion-implanted under the condition of 60 KeV and $1 \times 10^{15} - 1 \times 10^{16} cm^{-2}$ and P is doped in the amorphous silicon 105; when B (element of Group IV) is used as p type impurity, $BF_2^+$ is ion-implanted under the condition of 80 KeV and $1 \times 10^{15} - 1 \times 10^{16} cm^{-2}$ and B is doped in the amorphous silicon 10.

Process step (d): the amorphous silicon body 105 is p hot-etched and formed to an electrode shape by patterning.

Process step (e): after an inter-layer film 103a is deposited on the overall surface, contact holes 108a and 109 are formed to be coupled with lead wires; the contact hole 108a is formed down to the upper surface of the amorphous silicon 105; and the contact hole 109 is formed down to the upper surface of the impurity diffusion layer 102.

Process step (f): first, for example, a barrier metal of Ti-TiN is deposited by a sputtering method, then Al-Si is deposited by a sputtering method in hole 108a and the wiring electrode 104 and the upper electrode 106 are formed by patterning.

The basic structure of the element of the embodiment shown in FIG. 1 is formed by the above process step. Note that in process step (b) the $SiO_2$ may be formed to a thickness of 50°-100°Å by a thermal oxidation method in an atmosphere of; e.g., $N_2$ gas containing 2% $O_2$ at 900° C. for 30 min. Alternatively, the $SiO_2$ film may be formed to a thickness of several tens of angstroms in $H_2SO_4 + H_2O_2$, or the $SiO_2$ may be annealed at 900° C.

Example 5

Another embodiment of a method of manufacturing the semiconductor element according to the present invention will be described with reference to the semiconductor element shown in the embodiment of FIG. 3. This embodiment will be described in the sequence of process steps (A) to (E). Note that a process step (B2) is an additional process step for doping an impurity element to amorphous silicon, which is the same as the process step (c2) and the description thereof is omitted.

Process step (A): the impurity diffusion layer 102 is formed on the silicon semiconductor substrate 101, the inter-layer film 103 composed of $SiO_2$ or $SiN_4$ is formed on the overall surface thereof, and then a contact hole 108 is formed by lithography at a prescribed location on the impurity diffusion layer 102 where the amorphous silicon is to be deposited.

Process step (B): the amorphous silicon body 105 is deposited to a thickness of about 1500°Å by a CVD method at 560° C. and embedded in the contact hole 108.

Process step (B2): when impurity of Group III or V is doped to the amorphous silicon, the doping is carried out by ion-implanting P or B like the process (c2) in the embodiment 4.

Process step (C): the amorphous silicon body 105 is etched by a dry etching method using $CF_4$ to form it to an electrode shape.

Process step (D): after an inter-layer film 103a is deposited on the overall surface, contact holes 108a and 109 are formed to permit connection to lead wires.

Process step (E): the $SiO_2$ film 107 is formed to a thickness of about 100°Å or less by a CVD method; and the $SiO_2$ film 107 other than that on the amorphous silicon body 105 is removed by photo etching.

Process step (F): the wiring electrode 104 and the upper electrode 106 are formed by the same process step as the process step (f) of the embodiment 4 to complete the process.

Note that the semiconductor element according to the present invention is not only effective as an anti fuse but also applicable to a semiconductor device by being assembled to the above PLA or a general memory. In addition, as described above, this semiconductor element can be directly used as a PROM element and as a wiring connection switch of other devices. More specifically, when the semiconductor element is applied to a wiring connection switch, it is inserted to a portion where an IC having a macrocell such as a standard cell for a particular application is connected thereby to enable a user to create any type of IC on a desk top.

As described above, according to the present invention, since a program element is provided with the conventional amorphous silicon used at a portion serving as the anti fuse of the semiconductor element and the insulation film formed thereon and/or thereunder, a higher $R_{off}$ is secured by the silicon insulation film and reliability is secured by the amorphous silicon. Therefore, the multiplied effect of the above two operations improves the stability and reproducibility of a programming voltage and current. As a result, an element having the characteristic of a higher $R_{off}$ and a lower $R_{on}$ than conventional elements can be provided.

Further, in this arrangement, the $R_{off}$ is not affected even if an impurity is doped to the amorphous silicon because the $R_{on}$ is lowered, whereby the characteristic of the higher $R_{off}$ and the lower $R_{on}$ can be realized. In particular, with the arrangement shown in FIG. 3, since the upper electrode material itself and the barrier metal as a part thereof are prevented from reacting with the amorphous silicon, the manufacturing processes can be made easy.

As described above, since the anti fuse can be easily manufactured and easily applicable to PLA's and memory devices as application thereof, the present invention contributes to reducing the cost of an overall system.

According to certain embodiments of the present invention, a polycrystalline silicon, etc. formed on the upper side of a semiconductor substrate is used instead of a diffusion region, where the lower electrode is formed in the semiconductor substrate, and an oxide film is provided between the polycrystalline silicon and the amorphous silicon and/or between the amorphous silicon and the upper electrode, thereby obtaining the following effects:

In addition to the above effects, when an oxide film is formed from a thermal oxide film, the thermal influence on a semiconductor substrate can be reduced, thereby preventing the redistribution of impurities in the diffusion region of a semiconductor substrate. Therefore, a highly reliable semiconductor apparatus can be advantageously obtained.

Further, when a polycrystalline silicon is provided on the substrate, with an insulating film instead of an impurity layer, between the polycrystalline silicon and the substrate the following effects are obtained:

1. Since the oxidation rate of polycrystalline silicon is higher than that of a single crystalline silicon, the treatment can be completed at a low temperature and in a short time. Then there is less influence on the lower transistor properties.

2. The oxide film generated on a polycrystalline silicon has lower destruction pressure resistance compared with the oxide film generated on a single crystalline silicon. Therefore, the increase of the program voltage can be reduced.

3. An oxide film formed on polycrystalline silicon has worse crystalline properties compared with the oxide film generated on a single crystalline silicon, and therefore it is effective to cover amorphous silicon film. If the crystal properties of a film are good, there is a possibility that amorphous silicon will be polycrystallized at the interface with the oxide film.

This application relates to subject matter disclosed in Japanese Applications No. 209034/88, filed on Aug. 23, 1988 and No. 124486/89, filed May 19, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor element formed on a semiconductor substrate and comprising: a lower electrode disposed on said substrate; a resistance-state transition region disposed on said lower electrode, and an upper electrode disposed on said resistance-state transition region, wherein said resistance-state transistor region comprises a silicon oxide insulation film and an amorphous silicon body forming a two-layer structure between said electrodes, with said film interposed between said body and one of said electrodes, said silicon oxide insulation film is a deposited film discrete from each electrode and from said amorphous silicon body, said amorphous silicon body is a deposited body discrete from each said electrode and from said silicon oxide insulation film and said resistance-state transition region is of a composition capable of undergoing a transition, upon exposure to electrical current from a voltage applied between said lower and upper electrodes, from a high resistance state to a lower resistance state, wherein said silicon oxide insulation film is disposed on said lower electrode and said amorphous silicon body is interposed between said silicon insulation film and said upper electrode, and wherein said amorphous silicon body contains an impurity element selected from Group III or V of the Periodic Table.

2. The semiconductor element according to claim 1 wherein said lower electrode is formed in said semiconductor substrate and is composed of an impurity diffusion layer.

3. The semiconductor element according to claim 1 wherein at least one of said lower and upper electrodes is composed of polycrystalline silicon.

4. The semiconductor element according to claim 1 wherein said lower electrode is composed of polycrystalline silicon.

5. A semiconductor element formed on a semiconductor substrate and comprising: a lower electrode disposed on said substrate; a resistance-state transition region disposed on said lower electrode, and an upper electrode disposed on said resistance-state transistor region, wherein said resistance-state transition region comprises a silicon oxide insulation film and an amorphous silicon body forming a two-layer structure between said electrodes, with said film interposed between said body and one of said electrodes, said silicon oxide insulation film is a deposited film discrete from each electrode and from said amorphous silicon body, said amorphous silicon body is a deposited body discrete from each said electrode and from said silicon oxide insulation film and said resistance-state transition region is of a composition capable of undergoing a transition, upon exposure to electrical current from a voltage applied between said lower and upper electrodes, from a high resistance state to a lower resistance state, wherein said amorphous silicon body is disposed on said lower electrode and said silicon oxide insulation film is disposed between said amorphous silicon body and said upper electrode, and wherein said amorphous silicon body contains an impurity element selected from the Group III or V of the Periodic Table.

6. The semiconductor element according to claim 5 wherein said lower electrode is formed in said semiconductor substrate and is composed of an impurity diffusion layer.

7. The semiconductor element according to claim 1 wherein said silicon oxide insulation film is a thin film which will be broken upon exposure to the electrical current from the voltage applied between said lower and upper electrodes.

8. The semiconductor element according to claim 5 wherein said silicon oxide insulation film is a thin film which will be broken upon exposure to the electrical current from the voltage applied between said lower and upper electrodes.

* * * * *